(12) United States Patent
Koga et al.

(10) Patent No.: US 7,622,000 B2
(45) Date of Patent: Nov. 24, 2009

(54) LASER PROCESSING APPARATUS AND LASER PROCESSING METHOD

(75) Inventors: Norihisa Koga, Kikuchi-gun (JP); Shinji Koga, Kikuchi-gun (JP); Naoto Yoshitaka, Kikuchi-gun (JP); Akira Nishiya, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 655 days.

(21) Appl. No.: 11/258,040

(22) Filed: Oct. 26, 2005

(65) Prior Publication Data

US 2006/0090848 A1   May 4, 2006

(30) Foreign Application Priority Data

Oct. 29, 2004   (JP)   ............... 2004-316558

(51) Int. Cl.
| | |
|---|---|
| B05B 7/00 | (2006.01) |
| B05B 7/06 | (2006.01) |
| B05B 5/00 | (2006.01) |
| B05B 1/34 | (2006.01) |
| B05C 11/02 | (2006.01) |
| B05C 11/00 | (2006.01) |

(52) U.S. Cl. .............. 118/300; 118/313; 118/713; 118/62; 118/305; 118/642; 118/52; 239/601

(58) Field of Classification Search ............ 118/305, 118/321, 323, 319, 320, 313–316, 62, 63, 118/500, 504, 679–681, 687, 663, 641–643, 118/712, 713, 302, 602; 156/345, 345.55, 156/345.11, 345.17; 396/604, 611, 627; 427/240, 425; 239/601; 134/153, 198, 902

See application file for complete search history.

(56) References Cited

U.S. PATENT DOCUMENTS

2002/0136971 A1 * 9/2002 Ito et al. .................. 430/22
2004/0197433 A1 * 10/2004 Terada et al. ............. 425/174.4

FOREIGN PATENT DOCUMENTS

| JP | 2002-224878 | 8/2002 |
|---|---|---|
| JP | 2003-249427 | 9/2003 |

* cited by examiner

*Primary Examiner*—Yewebdar T Tadesse
(74) *Attorney, Agent, or Firm*—Oblon, Spivak, McClelland, Maier & Neustadt, L.L.P.

(57) ABSTRACT

A notch or the like of a wafer is detected via a guide member by means of a CCD camera provided so that an optical axis is coaxial to an optical axis of a laser beam, and alignment of the wafer is carried out. Next, in a state in which liquid ejected from a main nozzle or sub-nozzles is guided by means of the guide member, a laser beam whose optical axis is provided to be coaxial to the optical axis of the CCD camera is irradiated via the guide member. In addition, a predetermined processing operation is carried out with respect to the surface while an irradiation position of the laser beam is moved in a horizontal direction. The wafer is then transported from a chuck to the outside, and then, a purge gas is supplied to a bottom face of the guide member, and the bottom face is dried.

8 Claims, 9 Drawing Sheets

LASER PROCESSING APPARATUS AND LASER PROCESSING METHOD

CROSS-REFERENCE TO RELATED APPLICATIONS

This application is based upon and claims the benefit of priority from prior Japanese Patent Application No. 2004-316558, filed Oct. 29, 2004, the entire contents of which are incorporated herein by reference.

BACKGROUND OF THE INVENTION

1. Field of the Invention

The present invention relates to a laser processing apparatus and a laser processing method, in which liquid is applied to a surface of a substrate such as a semiconductor wafer or a glass substrate for use in liquid crystal displays, and the substrate covered with liquid is scanned with a laser beam and thereby processed.

2. Description of the Related Art

Methods of manufacturing semiconductor devices include steps of processing the surface of a substrate, by using a laser beam. Among these steps are: processing a thin film such as an insulating film, a metal film or a resist film; cutting dicing lines; removing resist films from alignment marks before exposing the substrate to light (i.e., step of exposing the alignment marks).

For example, in Jpn. Pat. Appln. KOKAI Publication No. 2002-224878, there is described a technique of forming a dicing line by scanning a laser beam on a substrate surface. In addition, in Jpn. Pat. Appln. KOKAI Publication No. 2003-249427, there is described a technique of, before carrying out exposure to a substrate, removing a resist film on the mark by means of a laser beam in order to expose the alignment mark formed in advance on the substrate. The laser beam has a large amount of energy, and enables alignment with high precision, and thus, is suitable for such a processing.

Figure 1:
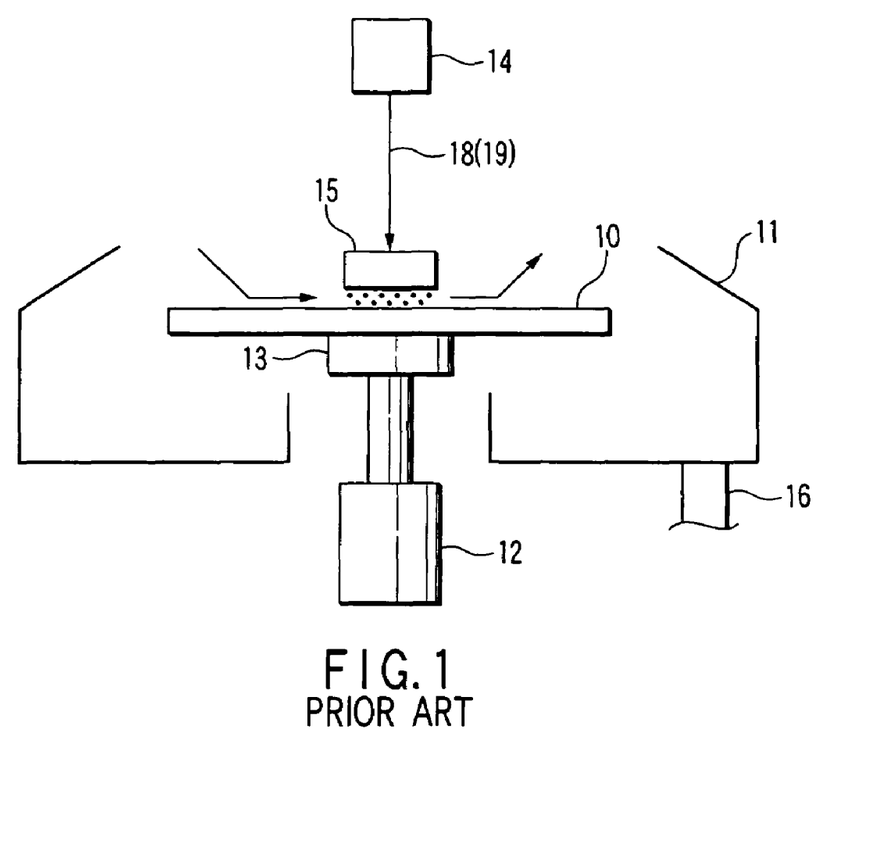
FIG. 1 is a schematic view of a configuration showing an overview of a conventional laser processing apparatus;.

In a laser processing apparatus described in the foregoing Jpn. Pat. Appln. KOKAI Publication No. 2002-224878, as shown in FIG. 1, a rotatable chuck 13 is provided in a cap 11 by means of a drive mechanism 12. This chuck 13 is moved and aligned in an X direction and a Y direction by means of a moving mechanism. In this manner, a laser beam 18 is irradiated from a laser image forming optical system unit 14 (hereinafter, referred to as a "optical system unit") to a resist film on an alignment mark of a substrate 10 held on the chuck 13 to remove the resist film. At this time, a transparent plate 15 consisting of quartz glass is disposed in an opposite manner to be slightly spaced from the substrate 10. Then, while pure water is supplied from one opening to a gap between the substrate 10 and the plate 15, the pure water is suctioned by the other opening. In this manner, a chip produced during a laser dicing processing operation is prevented from adhering to a surface of the substrate. After laser dicing processing, the plate 15 is raised, and the substrate 10 is rotated at a high speed. Then, water is cut from the top of the substrate 10, and the substrate 10 is dried.

In the meantime, in the laser dicing processing operation, there is a request for aligning the optical system unit 14 and the substrate 10 with each other with very high precision. However, in a conventional apparatus shown in FIG. 1, while pure water is supplied from one side between the transparent plate 15 and a surface of the substrate 10, the laser dicing processing operation is carried out by suctioning the pure water on the other side. Thus, at a time point at which the processing operation has terminated, the water adheres to a bottom face of the plate 15.

On the other hand, in the laser processing apparatus, in order to improve throughput, after the laser processing operation has been carried out with respect to one substrate, a next substrate is transported into the apparatus immediately, and a processing operation is carried out with respect to the next substrate. That is, immediately after the preceding substrate processing operation has terminated, the succeeding substrate alignment is carried out. Thus, there is no time for the bottom face of the plate 15 to dry. Thus, in a state in which water droplets have adhered to the bottom face of the plate 15 or in a state in which a moisture component has adhered to the bottom face of the plate 15 (in a state in which the plate becomes cloudy in a non-transparent manner), the succeeding substrate alignment is carried out. In such a state, a notch on the substrate side or an orientation flat (alignment site) is hardly seen upwardly, thus making it difficult to clearly identify and detect the alignment site. As a result, the optical system unit 14 and the substrate 10 cannot be aligned with very high precision, and a processing reliability is degraded.

BRIEF SUMMARY OF THE INVENTION

It is an object of the present invention to provide a laser processing apparatus and a laser processing method capable of aligning a laser image forming optical system and a substrate with each other with very high precision without degrading processing throughput.

Figure 2:
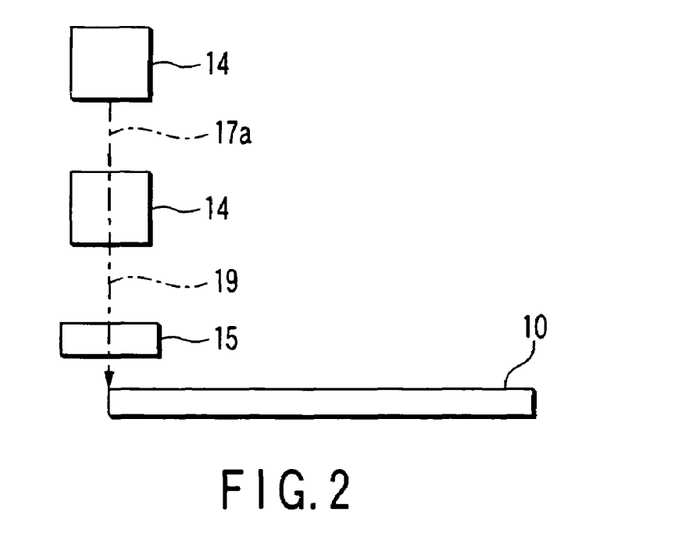
FIG. 2 is a schematic view of a configuration showing an overview of a laser processing apparatus.

The inventors discuss imaging a substrate alignment site (notch or orientation flat) by means of a CCD camera, and carrying out alignment based on the imaging data. As shown in FIG. 2, if an optical axis 19 of a laser beam and an optical axis 17a of a CCD camera 17 are shifted from each other (if these optical axes do not become coaxial to each other), the laser image forming optical system 14 and the substrate 10 cannot be aligned with each other with very high precision. Therefore, the inventors provide the present invention as described below.

A laser processing apparatus according to the present invention comprises: a substrate holding unit which horizontally holds a substrate; a laser beam irradiating unit which irradiates a laser beam onto a surface of a substrate held on the substrate holding unit in order to carry out a processing operation with respect to the surface of the substrate; imaging means having an optical axis which is coaxial to an optical axis of a laser beam incident to the substrate, the imaging means imaging a substrate in order to align the substrate with the laser beam irradiating unit; a liquid supply nozzle which supplies a liquid onto the surface of the substrate held on the substrate holding unit; a guide member provided between the substrate held on the substrate holding unit and the imaging means, the guide member having a bottom face facing the surface of the substrate, the guide member guiding the liquid ejected from the liquid supply nozzle so as to pass between the bottom face and the surface of the substrate, the guide member transmitting a laser beam from the laser beam irradiating unit; a purge gas nozzle which blows a purge gas to a bottom face of the guide member in order to remove a liquid adhering to the bottom face of the guide member; and a moving mechanism which moves the substrate holding unit and the laser beam irradiating unit relatively in a horizontal direction in order to move an irradiation position of a laser beam in a surface of the substrate.

It is preferable that the above described apparatus have a nozzle unit in which a liquid supply nozzle and a purge gas nozzle are incorporated together. Such a nozzle unit is an integrated molding product having a plurality of nozzles incorporated therein. In addition, an opening is formed at a center of the nozzle unit, whereby a guide member can be mounted in this opening.

The nozzle unit has a nozzle main body which supports the guide member. This nozzle main body has preferably a half divided cylinder shape.

The liquid supply nozzle and the purge gas nozzle each have ejection ports which are disposed so as to surround the guide member, and are incorporated in the nozzle main body. The guide member is formed in a reversed conical shape having a flat bottom face.

The liquid supply nozzle has: a main nozzle which faces the optical axis of the laser beam and supplies liquid immediately beneath the guide member; and a pair of sub-nozzles provided at both sides of the main nozzle and supplying liquid to the bottom face of the guide member.

Further, the apparatus has a first liquid supply unit which supplies a first liquid to the liquid supply nozzle; a second liquid supply unit which supplies a second liquid which is different from the first liquid to the liquid supply nozzle; and switching means for carrying out switching between the first liquid supply unit and the second liquid supply unit.

The substrate holding unit is substantially equal to a substrate in area of a two-dimensional image projected on an XY plane. The phrase "the areas of two-dimensional images on an XY plane are substantially equal to each other" used here denotes that a size of a spin chuck is equivalent to that of a wafer W to such an extent that no slackness occurs on the wafer mounted on the spin chuck. For example, if a diameter d2 of a spin chuck 2 is within the range of ±10 mm (d1−10 mm≦d2≦d1+10 mm) with respect to a diameter d1 of the wafer W, both of the spin chuck 2 and wafer W are substantially equal to each other in two-dimensional projection image area.

Further, the apparatus has a rotation mechanism which rotationally drives the substrate holding unit around a Z axis; and a control unit which moves the nozzle unit to a position for supplying a purge gas to an outer edge part of the substrate holding unit after the substrate has been transported from the substrate holding unit to the outside, rotates the substrate holding unit by means of the rotation mechanism, and controls the nozzle unit and the rotation mechanism so as to supply the purge gas from the purge gas nozzle to the outer edge part of the substrate holding unit.

A laser processing method according to the present invention has the steps of: (a) horizontally placing a substrate on a substrate holding unit; (b) imaging a site for carrying out alignment of the substrate via a guide member by imaging means, and then, carrying out the alignment of the substrate based on the imaged result; (c) in a state in which liquid is guided between a bottom face of the guide member and a surface of the substrate, irradiating a laser beam onto the surface of the substrate via the guide member, and carrying out laser processing with respect to the surface of the substrate while moving an irradiation position of the laser beam; and (d) supplying a purge gas to the bottom face of the guide member, and then removing the liquid adhering to the bottom face.

The substrate holding unit is substantially equal to the substrate in area of a two-dimensional image projected on an XY plane, and the step (d) may supply a purge gas to a peripheral edge part of the substrate holding unit while rotating the substrate around a Z axis.

DETAILED DESCRIPTION OF THE INVENTION

Hereinafter, preferred embodiments of the present invention will be described with reference to the accompanying drawings.

First Embodiment

Figure 3:
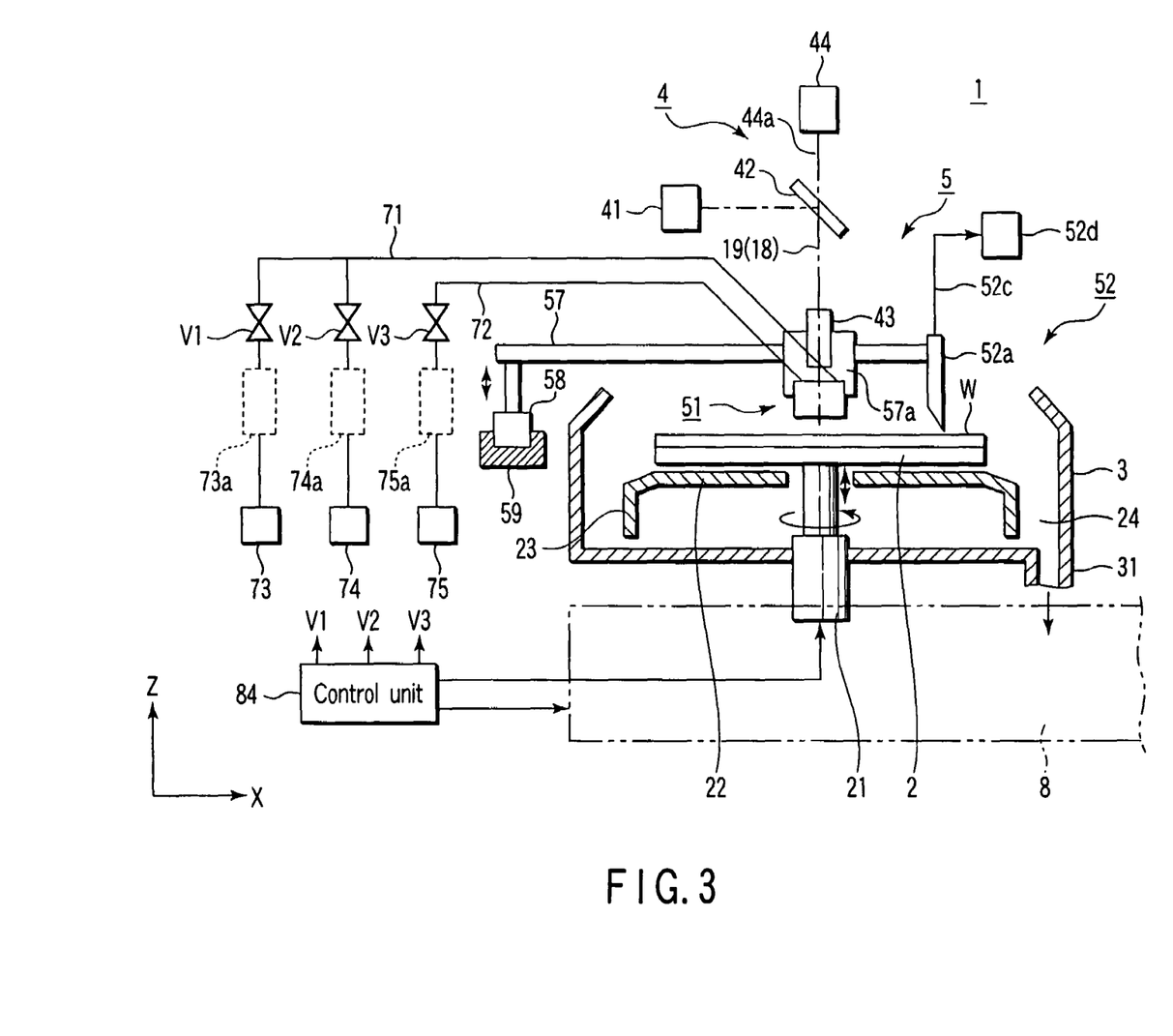
FIG. 3 is a block sectional view depicting a laser processing apparatus according to an embodiment of the present invention.

FIG. 3 is a entire view of a configuration showing a laser processing apparatus according to a first embodiment of the present invention. A laser processing apparatus 1 can be used according to types of processing operation such as dicing processing or thin film processing. Specifically, this apparatus is used for processing operations of processing a variety of thin films such as an insulating film, a metal film, and a resist film; forming a dicing line; or removing a resist film covering an alignment mark by means of laser beam irradiation before exposure.

The laser processing apparatus 1 comprises a spin chuck 2, a cup 3, a laser beam irradiating unit 4, a liquid film forming unit 5, a laser beam oscillator 41, a CCD camera 44, a nozzle unit 51, a pure water supply source 73, a cleaning liquid supply source 74, a gas supply source 75, and a control unit 84 or the like.

The spin chuck 2 is a substrate holding unit which vertically adsorbs and holds a wafer W. The spin chuck 2 is substantially equal to the wafer W in area of two-dimensional image projected on an XY plane in order to prevent slackness of the wafer W. The phrase "the areas of two-dimensional images on an XY plane are substantially equal to each other" used here denotes that a size of a spin chuck is equivalent to that of the wafer W to such an extent that no slackness occurs on the wafer mounted on the spin chuck. For example, if a diameter d2 of the spin chuck 2 is within the range of ±10 mm (d1−10 mm≦d2≦d1+10 mm) with respect to a diameter d1 of the wafer W, both of the spin chuck 2 and wafer W are substantially equal to each other in two-dimensional projection image area.

The spin chuck 2 is disposed in the cup 3 formed in a substantially cylindrical shape such that a top face of the cup opens; is rotationally driven around a vertical axis (Z axis) by means of a drive unit 21; and is driven to be elevated along the Z axis.

At a bottom part of the cup 3, an exhaust port (waste liquid exhaust port) 31 for exhausting a liquid (for example, pure water) dropped from the wafer W is provided in the vicinity of an outer edge of the bottom part.

In addition, a ring shaped horizontal plate section 22 is provided so as to surround the chuck 2 at a position immediately downward of the wafer W held on the chuck 2. The outer edge part of the horizontal plate section 22 is bent downwardly, and is formed as a cylindrically shaped section 23. A flow passage 24 is formed by this cylindrically shaped section 23 and the cup 3 so that pure water is exhausted from the waste liquid port 31 through the flow passage 24.

In addition, the laser processing apparatus 1 includes the laser beam irradiating unit 4 for carrying out a predetermined processing operation (for example, dicing or removing resist film or insulating film) with respect to the wafer W; and the liquid film forming unit 5 for forming a liquid film on the wafer W. The laser beam irradiating unit 4 is fixed to a sheath case, (not shown), and includes the laser beam oscillator 41, a half mirror 42, a laser image forming optical system unit (hereinafter, simply referred to as a "optical system unit") 43, and the CCD camera 44.

The laser beam oscillator 41 emits a processing laser beam such as a YAG laser or excimer laser. The half mirror 42 causes a laser beam 18 from the laser beam oscillator 41 to be oriented to a surface of the wafer W. The optical system unit (image forming unit) 43 is provided at a downstream side of the half mirror 42, and is a lens-barrel for forming the laser beam 18 as an image on the surface of the wafer W.

The CCD camera 44 is disposed so that its optical axis 44a coincides with an optical axis 19 from a laser beam (laser beam traveling from the half mirror 42 to a surface of the wafer W). That is, the CCD camera 44 is fixed to a sheath case of the laser processing apparatus 1, for example, so that its optical axis 44a travels to the surface of the wafer W through the half mirror 42. Here, the laser beam 18 from the laser oscillator 41 has a wavelength of about 532 nm or 355 nm. Even if the optical axis 44a of the CCD camera and the optical axis 19 of the laser oscillator 41 are coaxially provided, no processing problem occurs.

The liquid film forming unit 5 includes a liquid supply passage 71, a gas supply passage 72, a nozzle unit 51, and a liquid recovery unit 52. The liquid supply passage 71 is in communication with a pure water supply source 73 via a valve V1 and a supply control system 73a and with the nozzle unit 51. The gas supply passage 72 is in communication with a nitrogen gas supply source 75 via a valve V3 and a supply control system 75a, and with the nozzle unit 51. The supply control systems 73a, 74a, and 75a each include a mass flow controller (MFC) and a pump or the like.

The nozzle unit 51 has a plurality of nozzles 61, 62, 63, 64, and 65 and a guide member 66. The liquid recovery unit 52 has a recovery nozzle 52a for suctioning and recovering a liquid having passed through an irradiation position of the laser beam 18.

The nozzle unit 51, as shown in FIGS. 4 to 7, includes a nozzle main body 53 a fixing member 55, one main nozzle 61, two sub-nozzles 62 and 63, two purge gas nozzles 64 and 65, and the guide member 66. The main nozzle 61 and the sub-nozzles 62 and 63 supply a liquid (for example, pure water or cleaning liquid) onto the wafer W. The purge gas nozzles 64 and 65 supply purge gas (for example, nitrogen gas) onto the wafer W. The guide member 66 guides the liquid supplied from the nozzles 61, 62, and 63 so as to flow along the surface of the wafer W, and forms a liquid film. The guide member 66 is made of transparent quartz glass; is formed in a reversed conical shape; and has a flat bottom face 66b. These nozzles 61 to 65 and the guide member 66 are mounted on the nozzle main body 53.

Figure 8:
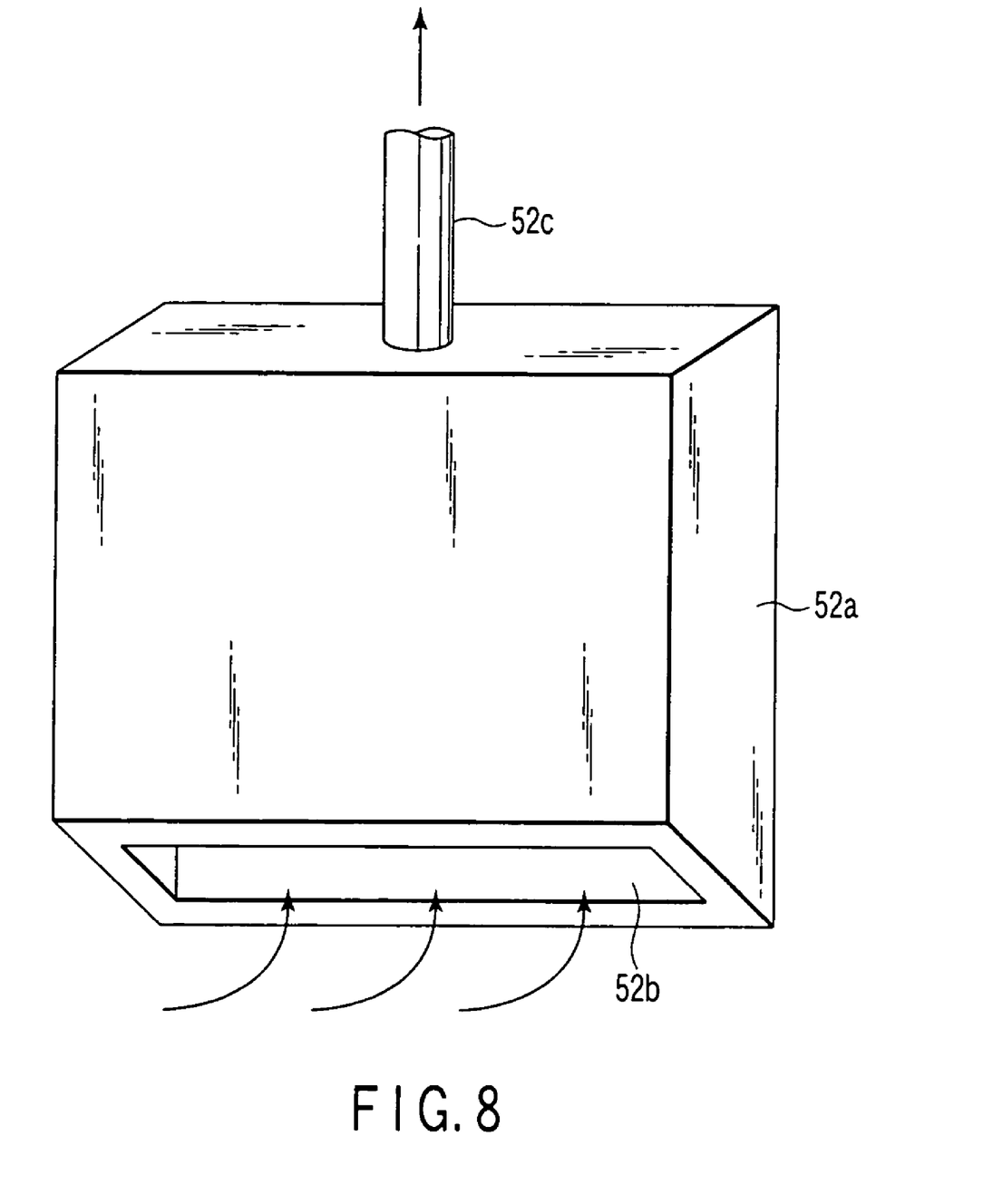
FIG. 8 is a schematic perspective view showing a recovery nozzle.

The liquid recovery unit 52, for example, as shown in FIG. 8, forms a substantial rectangular shape, and includes the recovery nozzle 52a, a liquid recovery passage 52c, and suction means 52d. The recovery nozzle 52a has a suction port 52b at its distal end so that a band shaped liquid flow formed on the wafer W can be recovered. The suction means 52d, as shown in FIG. 3 is provided as an ejector which acts a suction force via the liquid recovery path 52 with respect to the recovery nozzle 52a.

Figure 4:
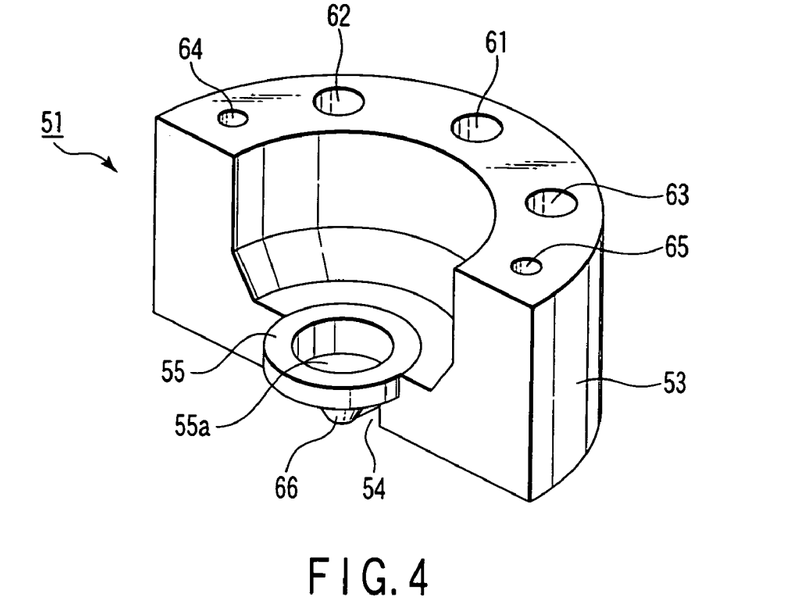
FIG. 4 is an exploded perspective view showing a nozzle unit when the unit is seen obliquely from above.
Figure 5:
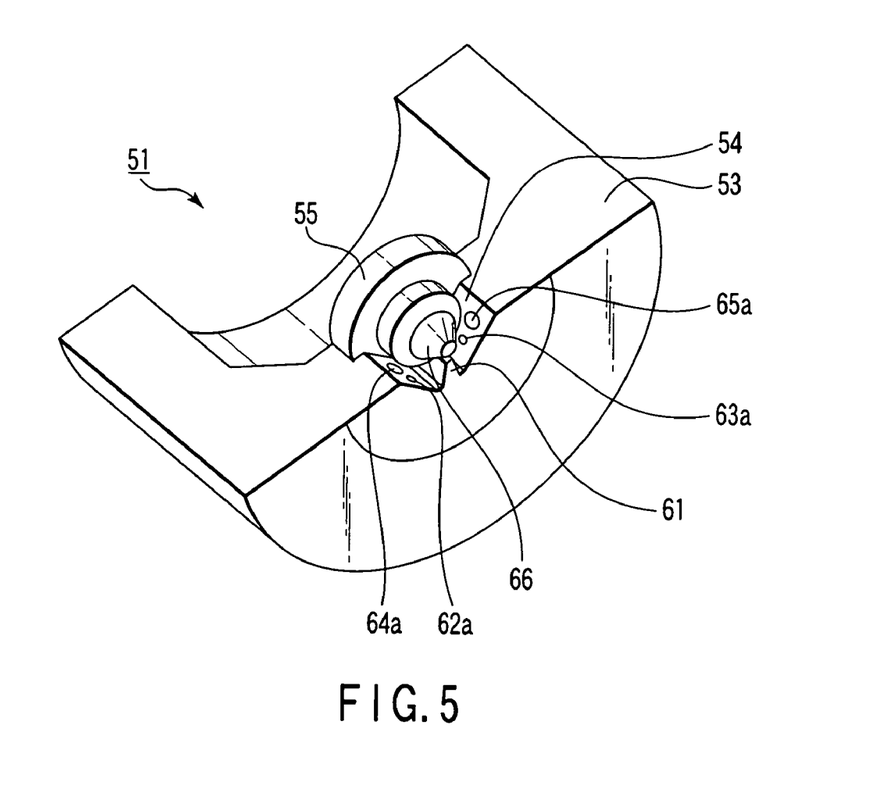
FIG. 5 is an exploded perspective view showing the nozzle unit when the unit is seen obliquely from beneath.

The nozzle main body 53 is provided as a half divided structure formed in a substantially semi-cylindrical shape, as shown in FIGS. 4 and 5. The nozzle main body is provided as an integrally molded product made of a resin such as polyvinyl chloride (PVC) or polytetrafluoro ethylene, for example, wherein a supply tube or a nozzle ejection port are incorporated. An opening 54 whose flat shape is a substantially semi-circular shape is formed at the center part of the nozzle main body 53. A plurality of supply pipes may not be integrally molded with the nozzle main body 53.

Figure 6:
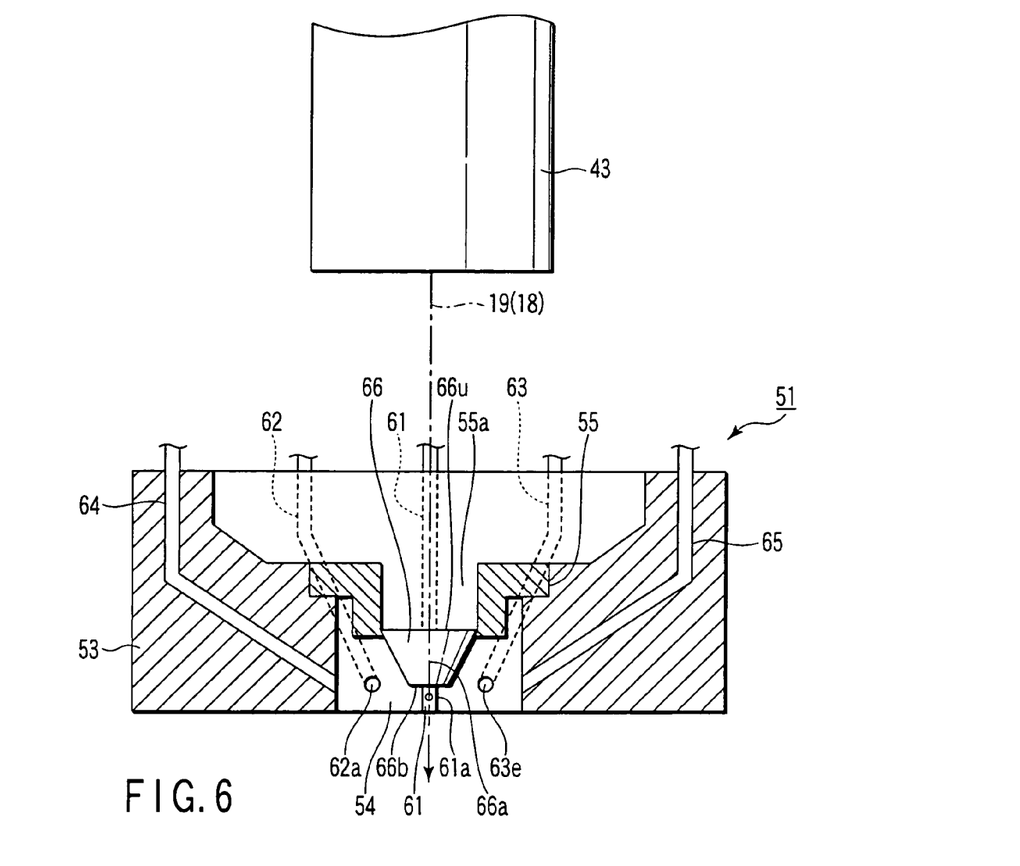
FIG. 6 is a vertical sectional view of the nozzle unit.

The fixing member 55, as shown in FIG. 6, is formed in a two-stepped ring shape, and its top large diameter portion is engaged with an opening 54 of the nozzle main body 53. The fixing member 55 is made of, for example, a resin or a ceramics such as polyvinyl chloride or polytetrafluoro ethylene. The guide member 66, as shown in FIG. 6, is formed in a conical shape, and its top large diameter portion is fixed to the nozzle main body 53 by means of the fixing member 55.

The opening 55a is formed at the center of the fixing member 55. This opening 55a is greater in size than a bottom face 66b of the guide member 66 and is smaller in size than a top face 66u of the guide member 66. The guide member 66 is inserted into this opening 55a, whereby the top side of the guide member 66 is mounted on the fixing member 55 in a state in which it is sandwiched in the opening 55a. In addition, the top large diameter portion of the fixing member 55 is mounted on a stepped portion of the nozzle main body 53, whereby the guide member 66 is fixed at a predetermined position of the nozzle main body 53.

As shown in FIG. 5 and FIG. 6, ejection ports 61a, 62a, 63a, 64a, and 65a of the nozzles open, respectively, to an area in the vicinity of a bottom face of the guide member 66, inwardly of the nozzle main body 53, and to an orientation in which a liquid is ejected.

In the main nozzle 61, when the guide member 66 is disposed at the nozzle main body 53, for example the ejection port 61a is positioned at the substantial center immediately beneath the bottom face of the guide member 66. The two sub-nozzles 62 and 63 include ejection ports 62a and 63a positioned transversely symmetrically with respect to the main nozzle 61. The two purge gas nozzles 64 and 65 include ejection ports 64a and 65a which are disposed at the outer periphery of the sub-nozzles 62 and 63, respectively, and which are positioned transversely symmetrically with respect to the main nozzle 61.

Figure 7:
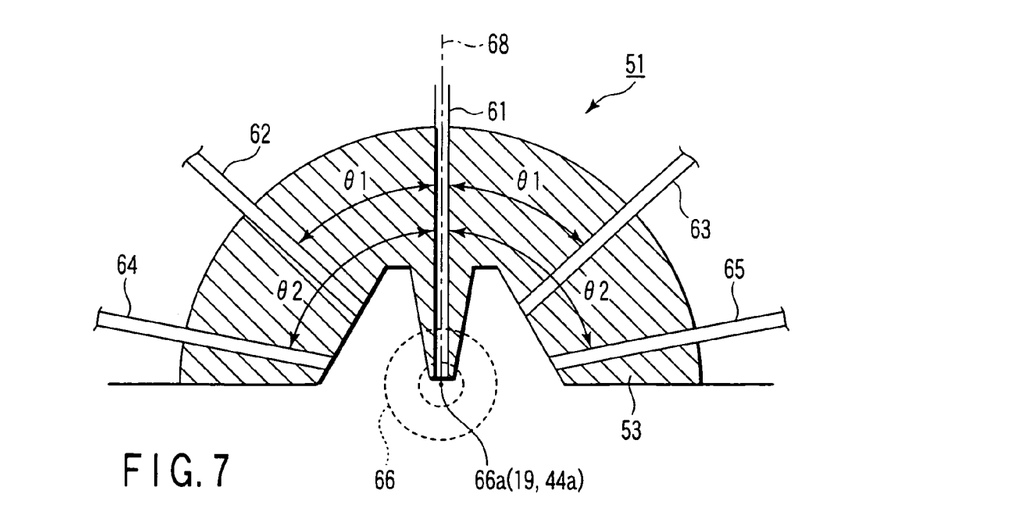
FIG. 7 is a horizontal sectional view of the nozzle unit.

As shown in FIG. 7, the two sub-nozzles 62 and 63 are disposed transversely symmetrically while a line 68 connecting the main nozzle 61 and the bottom face center of the guide member 66 to each other is defined as a center line. That is, the sub-nozzles 62 and 63 are disposed to be transversely divided at an angle ranging in the range of 30 degrees$\leq \theta 1 \leq$55 degrees, for example, from the center line 68. In addition, the two purge gas nozzles 64 and 65 are disposed to be transversely divided at an angle in the range of 65 degrees$\leq \theta 2 \leq$85 degrees, for example, from the center line 68.

The main nozzle 61 has an ejection port 61a which opens immediately beneath the center vicinity (optical axis) of the guide member bottom face 66. In addition, the sub-nozzles 62 and 63 and the purge gas nozzles 64 and 65 have ejection ports 62a, 63a, 64a, and 65a which open around the bottom face of the guide member 66, respectively.

The nozzle unit 51, the optical system unit 43, and the recovery nozzle 52a each are mounted on a horizontal arm 57. The proximal end side of the arm 57 is supported by means of an elevating mechanism 58, and further, is supported by means of a horizontal moving mechanism (not shown) having a rail 59. The elevating mechanism 58 and horizontal moving mechanism are provided to elevate and horizontally move the nozzle unit 51 or the like between a use position (position forming a liquid film on the wafer W) and a home position (position at the outside of the cup 3).

Here in the nozzle unit 51 and the recovery nozzle 52a, the guide member 66 and the recovery nozzle 52a are disposed to be opposite to each other so that a distance between them is about 100 mm. For example when the arm 57 is set at a use position, the guide member 66 and the recovery nozzle 52a are positioned on the arm 57 so that the lower end of the guide member 66 is positioned to be spaced from the surface of the wafer W about 3 mm and so that the lower end of the recovery nozzle 52a is positioned to be spaced from the surface of the wafer W about 1 mm. A relative height between the guide member 66 and the wafer W is adjusted to an optimum height according to a material to be irradiated by laser, depending on which an amount of generating a vapor is different.

In addition, the optical system unit 43 and the nozzle unit 51 each are mounted on the arm 57 so that the laser beam 18 passes through the optical system unit 43 and is formed as an image on the surface of the wafer W via the guide member 66 when these units are disposed at their use positions. That is, the optical system unit 43 and the nozzle unit 51 are supported on the arm 57 by means of a support member 57a in a positional relationship such that the laser optical axis 19 passes through the center of the optical system unit 43 and guide member 66. The elevating mechanism 58 is supported by means of a horizontal moving mechanism (not shown) to be movable along the rail 59 extending in a Y direction which passes through a paper face shown in FIG. 3.

The liquid supply passage 71 is connected in communication with the pure water supply source 73, the cleaning liquid supply source 74, the main nozzle 61 and the sub-nozzles 62 and 63, respectively. Valves V1 and V2 and the supply control systems 73a and 74a are provided in the liquid supply passage 71. In addition, the gas supply passage 72 is connected in communication with the nitrogen gas supply source 75 and the purge gas nozzles 64 and 65, respectively. A valve V3 and the supply control system 75a are provided in the gas supply passage 72. The supply control systems 73a, 74a, and 75a each have a mass flow controller MFC) and a pump.

These MFC, pump and valves V1, V2, and V3 are controlled by means of a control unit 84 so tat a supply flow rate of pure water, a supply flow rate of a cleaning liquid, and a supply flow rate of purge gas are controlled, respectively. The valve V1 and the valve V2 correspond to switching means between a first liquid supply unit (pure water supply systems 73, 73a, and 71) and a second liquid supply unit (cleaning liquid supply systems 74, 74a, and 71).

When the first liquid (pure water) or the second liquid (cleaning liquid) are supplied to the liquid supply passage 71 by controlling the opening and closing of the valve V1 and the valve 2, the pure water or cleaning liquid is ejected from the main nozzle 61 and the sub-nozzles 62 and 63 to the bottom face of the guide member 66. In the present embodiment, the sub-nozzles 62 and 63 are disposed around the main nozzle 61 at both sides of the main nozzle 61 and an ejection velocity of the liquid from the main nozzle 61 is set to as fast as 20 m per minute, for example. Further, a ejection velocity of the liquid from the sub-nozzles 62 and 63 is set to be slower than usual, whereby a material to be removed (released) from the surface of the wafer W during laser processing (for example, dicing) can be removed at a fast liquid flow without being diffused. In addition, the valve V3 is opened so as to cause purge gas (nitrogen gas) to communicate with the gas supply passage 72, whereby the purge gas is supplied from the nozzles 64 and 65 to the bottom face 66b of the guide member.

Figure 9:
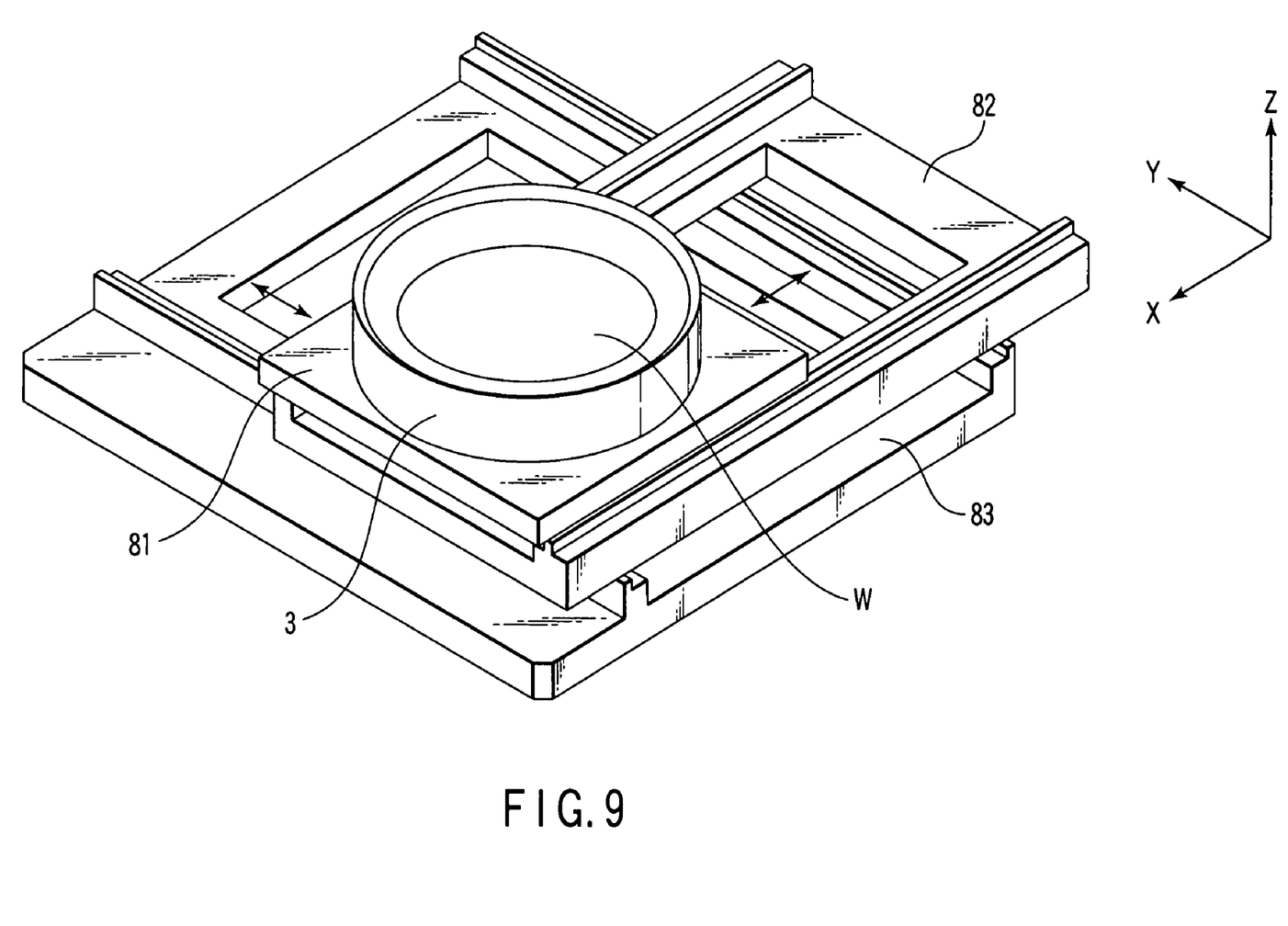
FIG. 9 is a schematic perspective view showing a cup and a moving mechanism.

Further, the laser processing apparatus 1, as indicated by the double dotted chain line in FIG. 3, includes an X-Y stage 8 which forms part of a moving mechanism moving the cup 3 along a horizontal face. As shown in FIG. 9, the X-Y stage 8 has a first stage 81 for placing the cup 3 and a second stage 82 having a drive mechanism for moving the first stage 81 in an X direction. The second stage 82 is supported to be movable in a Y direction on a base 83 fixed to a sheath case (not shown). That is, the first stage 81 is provided as an X stage which is movable in the X direction, and the second stage 82 is provided as a Y stage which is movable in the Y direction. The base 83 includes a drive mechanism (not shown) for moving the Y stage 82 in the Y direction. These drive mechanisms each consist of a guide rail, a ball screw mechanism, and a motor or the like.

In such a laser processing apparatus 1 opening and closing operations of the valves V1, V2, and V3 or each of the motors or the like, although not shown, of flow rate control units 73a, 74a, and 75a, the drive unit 21, and the X-Y stage 8 are controlled by means of the control unit 84.

Now, a description will be given with respect to a laser processing method to be carried out by the above described laser processing apparatus.

For example, a wafer W having an integrated circuit formed thereon is transported from a carrier arm (not shown) to the laser processing apparatus 1, and delivered to the chuck 2 incorporated in the cup 3 set at the delivery position. The delivery of this wafer W is carried out by elevating the chuck 2, for example. First, an orientation flat, a notch, or a target mark formed on the wafer W is detected by means of the CCD camera 44, and alignment of the wafer W is carried out based on the detected position.

Next, the cup 3 is moved by means of the X-Y stage 8, and a dicing start point on the wafer W is positioned on the optical axis 19 of the laser beam irradiating unit 4. The nozzle unit 51 and the recovery nozzle 52a are made proximal to the surface of the wafer W from the home position and the optical system unit 43 is aligned at the use position on the laser optical axis 19.

Figure 10A:
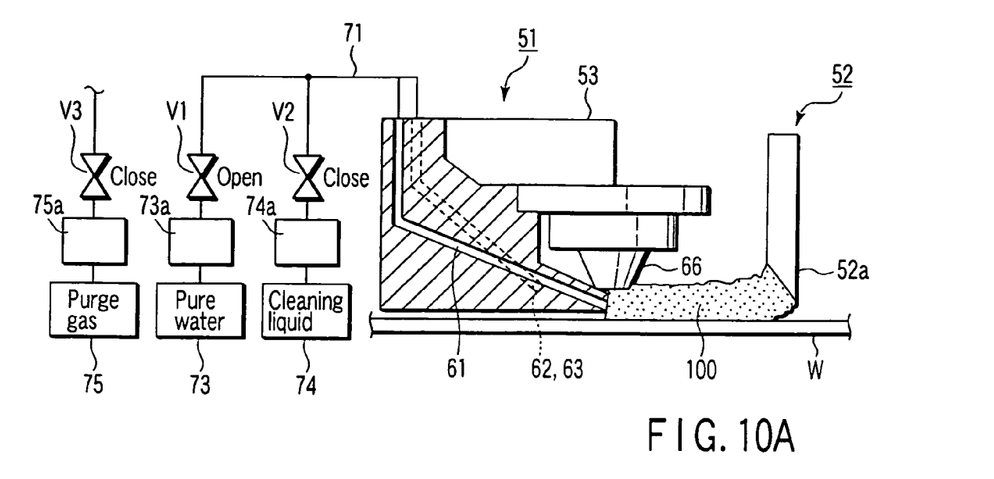
FIG. 10A is a block sectional view schematically showing a state when a surface of a substrate is subjected to a laser processing operation.

Next, the valve V1 is opened, and pure water is ejected from the main nozzle 61 and the sub-nozzles 62 and 63, respectively. In this manner as shown in FIG. 10A, a water flow (liquid film) 100 of pure water is formed downwardly of the guide member 66. At this time suction means 52d of the liquid recovery unit 52 is actuated, and the pure water having passed through the guide member 66 is recovered by means of the recovery nozzle 52a.

Figure 11:
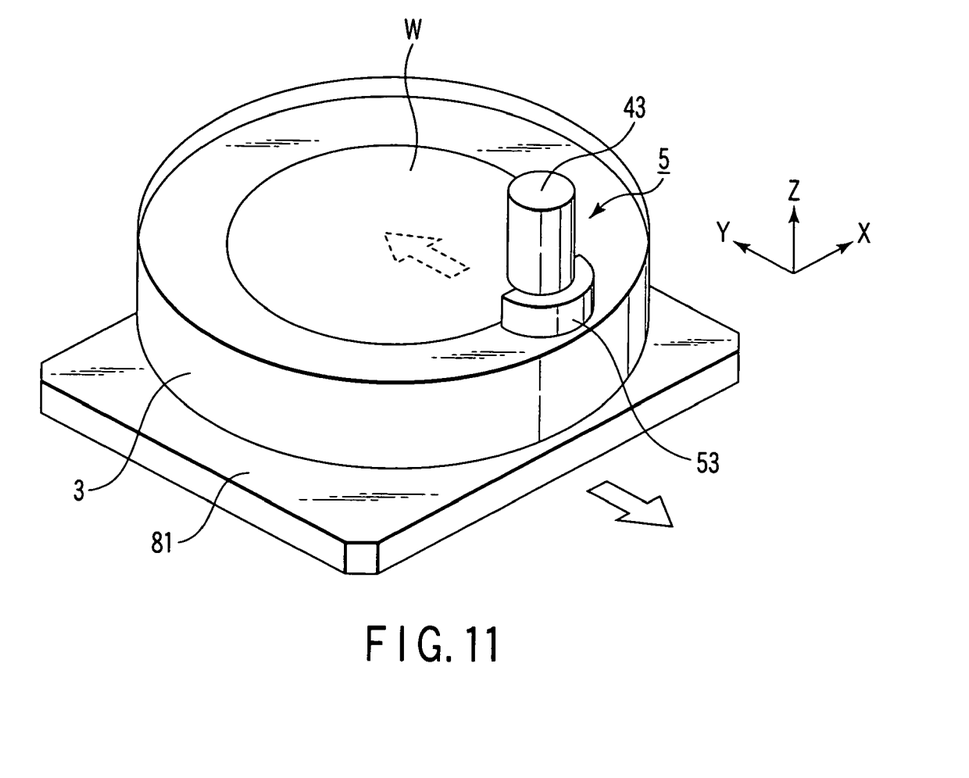
FIG. 11 is a perspective view showing essential portions of a laser processing apparatus while in the laser processing operation.

In a state in which the liquid film 100 of pure water has been thus formed on the wafer W, while the laser beam 18 is irradiated onto the surface of the wafer W, for example, as shown in FIG. 11, the chuck 2 is moved in the Y direction, for example by means of the X-Y stage 8. In this way, the surface of the wafer W is scanned in a fine shape by means of the laser beam. At this time, a liquid flow of the pure water supplied by means of the main nozzle 61 and the sub-nozzles 62 and 63 is formed in the direction of the arrow indicated by the dotted line shown in FIG. 11. The surface of the wafer W is cut by means of the laser beam 18, and the wafer W is half-cut. As a result a dicing line is formed.

The wafer W having the dicing line formed thereon is cut from a back face of the wafer W along the dicing line in accordance with the subsequent steps, and is broken into a number of chips. In addition, the chips shaven by the laser beams 18 are recovered by means of the recovery nozzle 52a with a liquid flow of pure water. Although a majority of the supplied pure water is recovered by means of the recovery nozzle 52a, part of the pure water drops in the cup 3. The dropped pure water is ejected via the exhaust port 31.

Figure 10B:
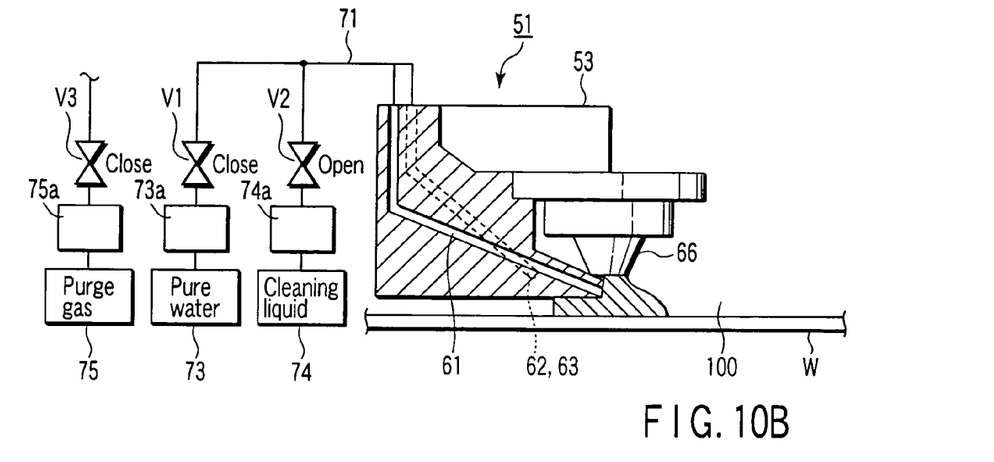
FIG. 10B is a block sectional view schematically showing a state when a surface of a substrate is subjected to a wash processing operation.

After the dicing line forming process has terminated, a wash processing operation of the wafer W is carried out as shown in FIG. 10B. The nozzle unit 51 or wafer W is moved to a position at which the liquid is supplied from the main nozzle 61 of the nozzle unit 51 to a substantial center of the wafer W. Then, irradiation of the laser beam from the laser beam irradiating unit 4 is sopped; the valve V1 is closed; and the valve V2 is opened. Then, isopropyl alcohol (IPA) is ejected as a cleaning liquid from the nozzles 61, 62, and 63 to the wafer W, and the wafer W is rotated at a predetermined rotation speed. The IPA spreads from the center part to the outer edge part of the surface of the wafer W due to a centrifugal force, and the pure water on the surface of the wafer W is substituted by the IPA. The shavings which remain on the wafer W are removed from the wafer W by means of a liquid flow of the IPA. In this way, after supplying the IPA and carrying out the wash processing operation for 5 seconds, for example, the valve V2 is closed, and the supply of the IPA from the nozzles 61, 62, and 63 is stopped. Then, the spin chuck 2 is rotated at a high speed; the IPA remaining on the wafer W is cut out; and the surface of the wafer W is dried.

After a series of the steps has thus terminated, the nozzle unit 51 and the guide member 6 are returned to their home position, and the chuck 2 is risen. Then, the wafer W is delivered to a carrier arm, although not shown.

Figure 10C:
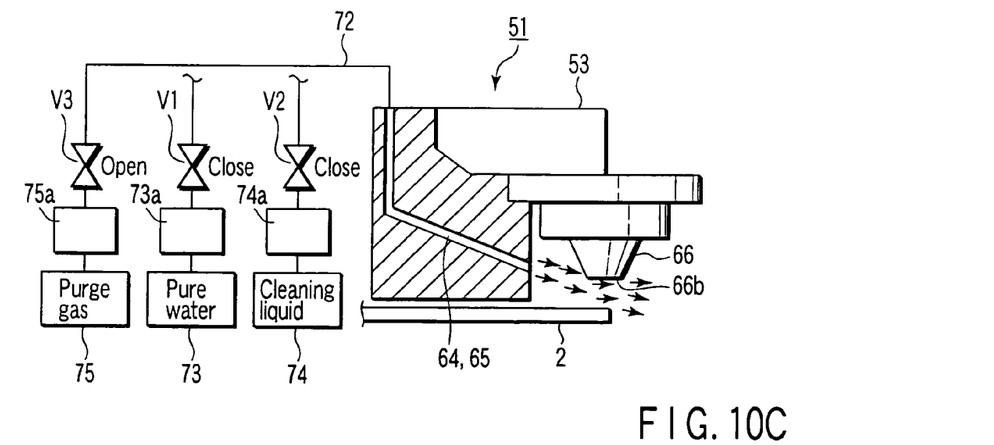
FIG. 10C is a block sectional view schematically showing a state when a guide member is subjected to a dry processing operation.
Figure 12:
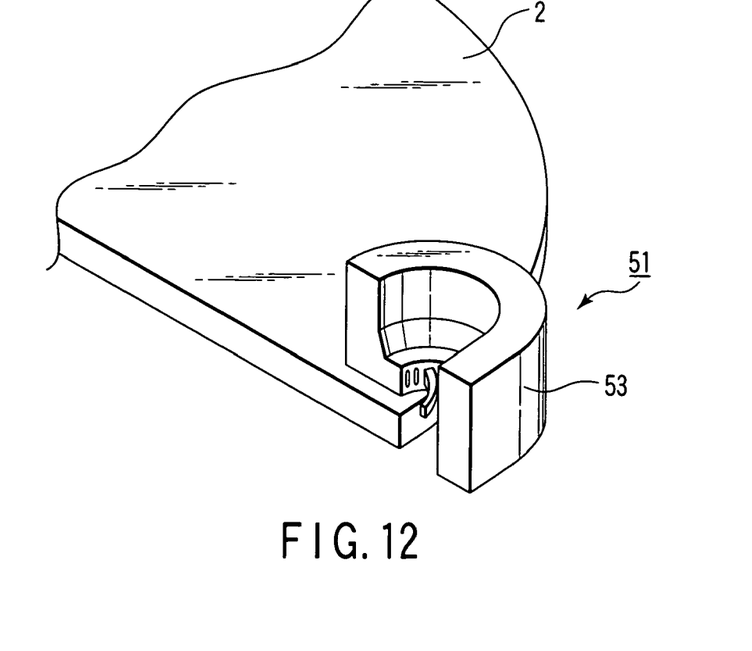
FIG. 12 is an exploded perspective view showing a cut-away part of the nozzle unit while in the dry processing operation.

Then, before a next wafer W2 is delivered to the chuck 2, the liquid adhering to the chuck 2 is dried. That is, as shown in FIGS. 10C and 12, the nozzle unit 51 or the chuck 2 is moved so that the nozzle unit 51 is positioned in a region in the vicinity of an outer edge of the chuck 2. Then, the valve V3 is opened, and nitrogen gas is supplied from the purge gas nozzles 64 and 65 to the region in the vicinity of the outer edge of the chuck 2 via the gas supply passage 72. During this drying process, the chuck 2 is rotated at a predetermined rotation speed (at 1000 rpm, for example).

In this manner, the purge gas is blown in the region in the vicinity of the outer edge of the chuck 2 via a region in the vicinity of the bottom face 66b of the guide member. The liquid (cleaning liquid) adhering to the bottom face 66b of the guide member is removed to be scattered by means of this purge gas, and the bottom face 66b of the guide member dries. In addition, the chuck 2 is substantially equal to the wafer W in size. Thus, after pure water or cleaning liquid is supplied, even drying is carried out by high speed rotation cutting, a moisture component is hardly removed from the outer end face of the chuck 2. Thus, liquid adheres to the outer end face of the chuck 2, and the liquid remains at the peripheral edge part of the chuck after the wafer W after processed has been transported to the outside. If purge gas is brown to this peripheral edge part, the liquid adhering to the region scatters due to the purge gas, and thus, the region dries. At this time, the chuck 2 is rotated, whereby the purge gas can be fully supplied to the whole periphery of the outer end face of the chuck 2 and the whole outer end face can be dried. In addition, drying of the region is promoted by the air flow generated by the rotation of the chuck 2.

Here, when the wafer W is washed, the opening and closing operations of the valve V1 and the valve V2 are switched, whereby the cleaning liquid and pure water may be alternately ejected from the nozzles 61, 62, and 63, or alternatively, the cleaning liquid (or pure water) may be supplied while the nozzle unit 51 is moved from the center of the wafer W to the outer edge. The movement (reciprocal movement) of this nozzle unit 51 may be carried out a plurality of times.

In addition, cleaning liquid drying is carried out while the purge gas is supplied from the nozzles 64 and 65, whereby the cleaning liquid drying is promoted by the purge gas. At this time, the nozzle unit 51 may supply the purge gas at the position in the vicinity of the center of the wafer W or may supply the purge gas while the nozzle unit is moved from the center to the outer edge of the wafer W.

In this way, a series of the steps of carrying out transportation of the wafer W to the inside; laser processing, wash processing, dry processing, transportation of the wafer W to the outside, and supply of purge gas are carried out based on a predetermined program. This program is stored in a built-in memory of the control unit 84.

According to the above described embodiment, even if a liquid adheres to the bottom face 66b of the guide member 66 when the laser processing of the wafer W terminates, purge gas is blown to the bottom face 66b, whereby removal of water droplets adhering to the bottom face can be carried out. In this manner, when a notch or the like of the next wafer W is imaged by means of the CCD camera 44 via the guide member 66, it is possible to suppress the liquid from adhering to the bottom face of the guide member or the bottom face from being cloudy. Thus, the notch or the like is easily detected, and alignment of the wafer W can be carried out with high precision.

According to the present invention, the liquid guided by means of the guide member is interposed on the substrate surface, and a laser beam is irradiated, thereby carrying out a predetermined processing operation. At this time, purge gas is supplied to the bottom face of the guide member after laser processing. Thus, the liquid adhering to the bottom face is removed. In this manner, when a substrate is imaged via the guide member by imaging means in order to carry out alignment of a next substrate, it is possible to suppress the liquid from adhering to the bottom face of the guide member or the lower face from being cloudy. Thus, a substrate alignment section is easily detected, and alignment can be carried out with high precision.

In addition, according to the above described embodiment, the main nozzle 61 the sub-nozzles 62, 63 and the purge gas nozzles 64 and 65 are incorporated in the nozzle unit 51 and the guide member 66 is fixed to the nozzle unit 51. Thus, the liquid or purge gas is reliably supplied from each of the nozzles 61, 62, 63, 64, and 65 to the guide member 66. In addition, each of the nozzles 61, 62, 63, 64, and 65 is disposed inside of the nozzle main body 53 so that each of the ejection ports 61*a*, 62*a*, 63*a*, 64*a*, and 65*a* is positioned outside of the guide member 66. Thus, the liquid or purge gas can be supplied to the guide member 53 more reliably. In this way, the guide of the liquid can be reliably carried out by means of the guide member 66, and the liquid adhering to the bottom face 66*b* of the guide member can be efficiently dried by means of the purge gas.

In addition, according to the above described embodiment the nozzle unit 51 is positioned in the region in the vicinity of the outer edge part of the chuck 2. Thus, the outer edge face of the chuck 2 is dried by supplying the purge gas at the same time. If the liquid adheres to the chuck 2, there is a danger that particles are transferred onto the wafer W when the wafer W is placed on the chuck 2 by carrying means. However, in the present embodiment, the outer edge face of the chuck 2 is dried by means of the purge gas every time laser processing is carried out, whereby the adhering of the particles to the wafer W can be prevented.

In addition, in the above described embodiment, the sub-nozzles 62 and 63 are disposed at both of the left and right sides of the main nozzle 61. The sub-nozzles 62 and 63 are positioned in the vicinity of the distal end of the main nozzle 61 and include ejection ports 62*a* and 63*a* disposed transversely symmetrically with respect to the main nozzle 61. The nozzles 61, 62, and 63 are thus disposed, and thus, the spread of the liquid flow from the main nozzle 61 is suppressed by means of the liquid flow from the sub-nozzles 62 ad 63 so that the liquid flow can be concentrated on the region in the vicinity of the bottom face of the guide member 66.

Further, in the above described embodiment, a wash processing operation is carried out while pure water is switched to cleaning liquid, so that laser chips can be removed from the wafer W more reliably. Further, in the case where the whole chuck 2 is periodically washed, the apparatus according to the present embodiment can be used. For example, in order to remove a foreign matter which affects a degree of flatness on the chuck 2, for example, pure water or cleaning liquid is supplied from the main nozzle 61 or the sub-nozzles 62 and 63 while the chuck 2 is rotated. In this manner, when these liquids are dried, the purge gas can be supplied from the purge gas nozzles 64 and 65.

Furthermore, in the above described embodiment, the nozzle main body 53 and the nozzles 61, 62, 63, 64, and 65 are integrally molded with each other. Thus, liquid or purge gas can be reliably supplied to the guide member 66. As a result, there is no need for fine adjustment after assembling the laser processing apparatus or it is possible to easily make fine adjustment.

In addition, in the above described embodiment, while the nozzle unit 51 is moved from its home position to its use position, there is no danger that the relative positions of a plurality of nozzles 61, 62, 63, 64, and 65 are shifted. Thus, it is possible to reliably supply liquid or purge gas to the guide member 66. In addition, the nozzle main body 53 and the optical system unit 43 are integrally formed each other so that a center axis 66*a* of the guide member and the optical axis 19 of a laser beam can be coaxially set, and there is no danger that both of the axes 66*a* and 19 are shifted during movement.

Further, in the above described embodiment, a plurality of nozzles 61, 62, 63, 64 and 65 are incorporated in the single nozzle unit 51. Thus, it becomes possible to supply liquids or gases which are variously combined with each other by merely changing a each of line which is in communication with these nozzles 61 to 65.

In the foregoing description, according to the present invention a wash processing operation after laser processing may not be necessarily carried out. In this case, after laser processing, the wafer W is rotated at a high speed, and is dried by cutting the pure water on the wafer W. Next, the wafer W is transported to the outside from the laser processing apparatus. Then, the nozzle unit 51 is positioned in the vicinity of the outer edge of the chuck 2, and purge gas is supplied. In this manner, drying of the bottom face 66*b* of the guide member 66 and drying of the outer end face of the chuck 2 are carried out at the same time.

Second Embodiment

Figure 13:
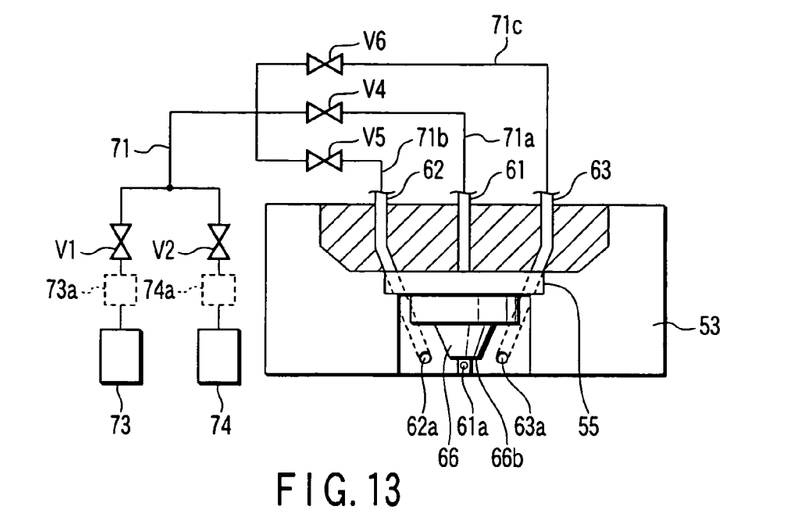
FIG. 13 is a block sectional view showing a liquid supply system and a nozzle unit according to another embodiment.

Now, a second embodiment will be described with reference to FIG. 13. A duplicate description in this embodiment with respect to the above-described embodiment is omitted here.

In the present embodiment, in the case where cleaning liquid is supplied after being switched from pure water, any one or two of a main nozzle 61 and sub-nozzles 62 and 63 is or are used. As shown in FIG. 13, liquid supply passages 71*a*, 71*b*, and 71*c* are provided between the main nozzle 61, the sub-nozzles 62 and 63, and a liquid supply passage 71. The liquid supply passages 71*a*, 71*b*, and 71*c* include valves V4, V5, and V6, respectively.

In the present embodiment, a control unit 84 controls the opening and closing of valves V1, V2, V4, V5, and V6. In this manner, a flow passage communicating with the nozzles 61, 62, and 63 is switched, and the pure water or cleaning liquid is supplied to the surface of the wafer W with respect to the switched liquid supply passage.

Third Embodiment

Figure 14:
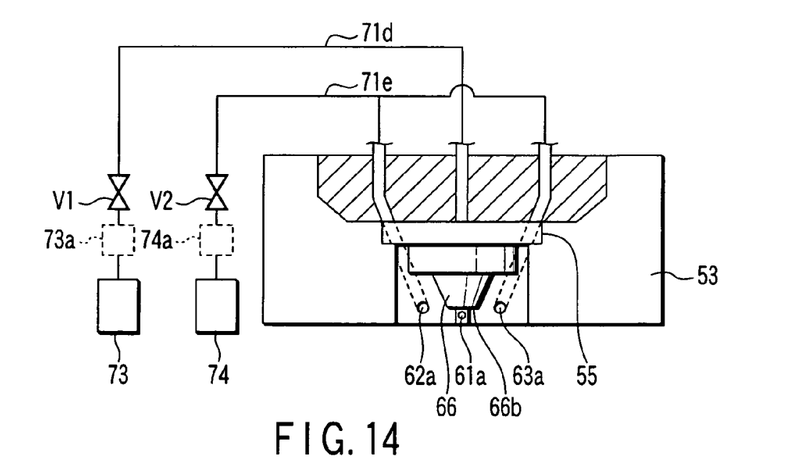
FIG. 14 is a block sectional view showing a liquid supply system and a nozzle unit according to a still another embodiment.

Now, a third embodiment will be described with reference to FIG. 14. A duplicate description in this embodiment with respect to the above-described embodiment is omitted here.

In the present embodiment, pure water is supplied from a main nozzle 61 instead of supplying pure water or cleaning liquid by switching it, so as to supply the cleaning liquid from sub-nozzles 62 and 63. A first liquid supply passage 71*d* is in communication with a pure water source 73 and the main nozzle 61, respectively, and includes a valve V1 and a supply control system 73*a*. A second liquid supply passage 71*e* is in communication with a pure water source 74 and the sub-nozzles 62 and 63, respectively, and includes a valve V2 and a supply control system 74*a*.

In the present embodiment, the control unit 84 controls the opening and closing of the valves V1 and V2. In this manner, a flow passage communicating with the nozzles 61, 62, and 63 is switched, and the pure water or cleaning liquid is supplied to the surface of the wafer W with respect to the switched liquid supply passage.

Further, in the main nozzle 61 and the two sub-nozzles 62 and 63, separate three types of liquid may be supplied. In addition, the main nozzle 61 and the sub-nozzles 62 and 63 are used as a dedicated nozzle for supplying pure water, and a nozzle for supplying cleaning liquid may be additionally newly provided.

Fourth Embodiment

Figure 15:
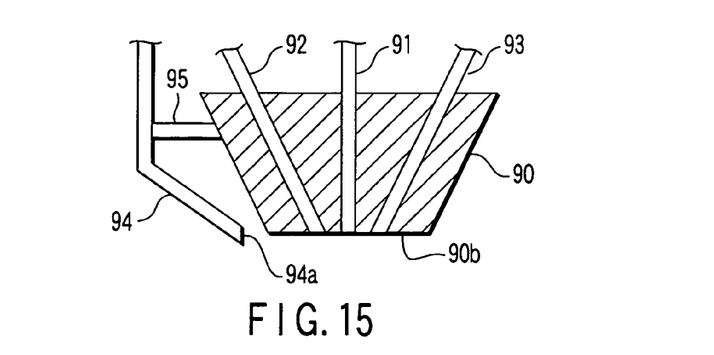
FIG. 15 is a longitudinal sectional view showing a nozzle unit according to a yet another embodiment.

Now, a fourth embodiment will be described with reference to FIG. 15. A duplicate description in this embodiment with respect to the above-described embodiment is omitted here.

In a nozzle unit according to the present embodiment, a main nozzle 91 and sub-nozzles 92 and 93 are integrally incorporated in a guide member 90 itself. In addition, a gas nozzle 94 is provided in the vicinity of the guide member 90 independently of these nozzles 91, 92, and 93. The gas nozzle 94 is supported to be mounted on the guide member 90 by means of a support member 95 so that an ejection port 94a is oriented to a bottom face 90b of the guide member.

After laser processing (for example, dicing), purge gas (nitrogen gas) is supplied to the gas nozzle 94 and the purge gas (nitrogen gas) is blown to the bottom face 90b of the guide member. Then, the bottom face 90b of the guide member 90b is dried.

According to the present embodiment, a nozzle unit is further downsized, and a laser processing apparatus can be downsized.

In the foregoing description, the present invention can be applied to laser processing operations such as mask correction or marking in addition to the above described laser processing operation of forming a dicing line.

What is claimed is:

1. A laser processing apparatus comprising:
   a substrate holding unit which horizontally holds a substrate;
   a laser beam irradiating unit which irradiates a laser beam onto a surface of a substrate held on the substrate holding unit in order to carry out a processing operation with respect to the surface of the substrate;
   imaging means having an optical axis which is coaxial to an optical axis of a laser beam incident to the substrate, the imaging means imaging a substrate in order to align the substrate with the laser beam irradiating unit;
   a liquid supply nozzle which supplies a liquid onto the surface of the substrate held on the substrate holding unit;
   a guide member provided between the substrate held on the substrate holding unit and the imaging means, being formed in a reversed conical shape having a flat bottom face, the guide member having a bottom face facing the surface of the substrate, the guide member guiding the liquid ejected from the liquid supply nozzle so as to pass between the bottom face and the surface of the substrate, the guide member transmitting a laser beam from the laser beam irradiating unit;
   a nozzle unit including a nozzle main body which forms a half divided cylinder shape, and supports the guide member;
   a purge gas nozzle which blows a purge gas to a bottom face of the guide member in order to remove a liquid adhering to the bottom face of the guide member, the liquid supply nozzle and the purge gas nozzle each have ejection ports disposed so as to surround the guide member, and are incorporated in the nozzle main body; and
   a moving mechanism which moves the substrate holding unit and the laser beam irradiating unit relatively in a horizontal direction in order to move an irradiation position of a laser beam in a surface of the substrate.

2. The apparatus according to claim 1, wherein the liquid supply nozzle includes:
   a main nozzle which faces the optical axis of the laser beam and supplies liquid immediately beneath the guide member; and
   a pair of sub-nozzles provided at both sides of the main nozzle and supplying liquid to the bottom face of the guide member.

3. The apparatus according to claim 2, further comprising:
   a first liquid supply unit which supplies a first liquid to the liquid supply nozzle;
   a second liquid supply unit which supplies a second liquid which is different from the first liquid to the liquid supply nozzle; and
   means for switching between the first liquid supply unit and the second liquid supply unit.

4. The apparatus according to claim 2, further comprising:
   a first liquid supply unit which supplies a first liquid to either of the main nozzle and the sub-nozzles; and
   a second liquid supply unit which supplies a second liquid to the main nozzle or the sub-nozzles not supplied with the first liquid.

5. The apparatus according to claim 1, further comprising:
   a first liquid supply unit which supplies a first liquid to the liquid supply nozzle;
   a second liquid supply unit which supplies a second liquid which is different from the first liquid to the liquid supply nozzle; and
   switching means for carrying out switching between the first liquid supply unit and the second liquid supply unit.

6. The apparatus according to claim 5, further comprising:
   a first liquid supply unit which supplies a first liquid to either of a main nozzle and sub-nozzles; and
   a second liquid supply unit which supplies a second liquid to the main nozzle or the sub-nozzles not supplied with the first liquid.

7. The apparatus according to claim 1, wherein the substrate holding unit is substantially equal to a substrate in area of a two-dimensional image projected on an XY plane, and further includes:
   a rotation mechanism which rotationally drives the substrate holding unit around a Z axis; and
   a control unit which moves the nozzle unit to a position for supplying a purge gas to an outer edge part of the substrate holding unit after the substrate has been transported from the substrate holding unit to the outside, rotates the substrate holding unit by means of the rotation mechanism, and controls the nozzle unit and the rotation mechanism so as to supply the purge gas from the purge gas nozzle to the outer edge part of the substrate holding unit.

8. The apparatus according to claim 1, further comprising:
   a first liquid supply unit which supplies a first liquid to either of a main nozzle and sub-nozzles; and
   a second liquid supply unit which supplies a second liquid to the main nozzle or the sub-nozzles not supplied with the first liquid.

* * * * *